(12) United States Patent
Hartig

(10) Patent No.: US 10,056,238 B2
(45) Date of Patent: Aug. 21, 2018

(54) ADJUSTABLE RETURN PATH MAGNET ASSEMBLY AND METHODS

(71) Applicant: Cardinal CG Company, Eden Prairie, MN (US)

(72) Inventor: Klaus H. W. Hartig, Avoca, WI (US)

(73) Assignee: Cardinal CG Company, Eden Prairie, MN (US)

( * ) Notice: Subject to any disclaimer, the term of this patent is extended or adjusted under 35 U.S.C. 154(b) by 99 days.

(21) Appl. No.: 15/193,484

(22) Filed: Jun. 27, 2016

(65) Prior Publication Data

US 2017/0372880 A1    Dec. 28, 2017

(51) Int. Cl.
*C23C 14/34* (2006.01)
*H01J 37/34* (2006.01)
*C23C 14/35* (2006.01)

(52) U.S. Cl.
CPC .......... *H01J 37/3455* (2013.01); *C23C 14/35* (2013.01); *H01J 37/3405* (2013.01)

(58) Field of Classification Search
CPC .... H01J 37/3455; H01J 37/3405; C23C 14/35
See application file for complete search history.

(56) References Cited

U.S. PATENT DOCUMENTS

| 4,309,266 A * | 1/1982 | Nakamura .......... H01J 37/3455 204/192.12 |
| 4,734,183 A * | 3/1988 | Wirz .................. H01J 37/3455 204/192.12 |
| 4,964,968 A | 10/1990 | Arita et al. |
| 5,399,253 A | 3/1995 | Gruenenfelder et al. |
| 5,415,754 A | 5/1995 | Manley et al. |
| 5,685,959 A | 11/1997 | Bourez et al. |
| 6,299,740 B1 | 10/2001 | Hieronymi et al. |
| 6,372,098 B1 | 4/2002 | Newcomb |
| 6,395,146 B2 | 5/2002 | Hieronymi et al. |
| 6,416,639 B1 | 7/2002 | De Bosscher et al. |
| 6,821,397 B2 | 11/2004 | Krassnitzer |
| 7,347,919 B2 | 3/2008 | Sato et al. |
| 7,368,041 B2 | 5/2008 | Krassnitzer |
| 7,678,240 B2 | 3/2010 | Krassnitzer |
| 8,273,221 B2 | 9/2012 | Schneider et al. |
| 8,685,214 B1 | 4/2014 | Moh et al. |
| 8,951,394 B2 | 2/2015 | Bernick et al. |

(Continued)

FOREIGN PATENT DOCUMENTS

| EP | 2009670 A1 | 12/2008 |
| EP | 2669403 A1 | 12/2013 |

(Continued)

OTHER PUBLICATIONS

International Patent Application No. PCT/US2017/034190, International Search Report and Written Opinion dated Aug. 25, 2017, 12 pages.

(Continued)

*Primary Examiner* — John J Brayton
(74) *Attorney, Agent, or Firm* — Fredrikson & Byron, P.A.

(57) ABSTRACT

The invention provides a sputter deposition assembly that includes a sputtering chamber, a sputtering target, and a magnet assembly. The magnet assembly includes a magnetic backing plate with a blind recess into which a moveable magnetic control body can be adjustably disposed.

27 Claims, 10 Drawing Sheets

(56) References Cited

U.S. PATENT DOCUMENTS

| | | |
|---|---|---|
| 2006/0065525 A1 | 3/2006 | Weichart |
| 2009/0200158 A1 | 8/2009 | Ehiasarian |
| 2009/0205949 A1* | 8/2009 | Zueger ................ H01J 37/3408 204/192.12 |
| 2009/0229970 A1 | 9/2009 | Itagaki et al. |
| 2009/0229977 A1 | 9/2009 | Kondo et al. |
| 2009/0242396 A1* | 10/2009 | Brcka ................ H01J 37/3405 204/298.16 |
| 2009/0277779 A1 | 11/2009 | Sasaki |
| 2010/0006424 A1 | 1/2010 | Chung et al. |
| 2011/0079509 A1* | 4/2011 | Morohashi ............ C23C 14/352 204/192.12 |
| 2013/0180851 A1 | 7/2013 | Kong et al. |
| 2013/0299349 A1 | 11/2013 | Kuriyama et al. |
| 2014/0054168 A1 | 2/2014 | German et al. |
| 2014/0158523 A1 | 6/2014 | Newcomb |
| 2015/0075970 A1* | 3/2015 | Miller ................ H01J 37/3452 204/192.12 |
| 2015/0194294 A1 | 7/2015 | Bernick et al. |
| 2017/0369985 A1 | 12/2017 | Hartig |

FOREIGN PATENT DOCUMENTS

| | | | |
|---|---|---|---|
| JP | 05214527 A | * | 8/1993 |
| JP | 2907620 B2 | | 6/1999 |
| JP | 2012077360 A | * | 4/2012 |

OTHER PUBLICATIONS

International Patent Application No. PCT/US2017/034197, International Search Report and Written Opinion dated Aug. 21, 2017, 14 pages.
U.S. Appl. No. 15/193,507, Non-Final Office Action dated Dec. 8, 2017, 10 pages.
U.S. Appl. No. 15/193,507, Amendment and Response to Non-Final Office Action filed Mar. 7, 2018, 15 pages.
U.S. Appl. No. 15/193,507, Final Office Action dated Apr. 27, 2018, 6 pages.
U.S. Appl. No. 15/193,507, Response to Final Office Action filed Jun. 27, 2018, 5 pages.
U.S. Appl. No. 15/193,507, Applicant Summary of Interview with Examiner filed Jun. 27, 2018, 2 pages.

* cited by examiner

Fig. 6
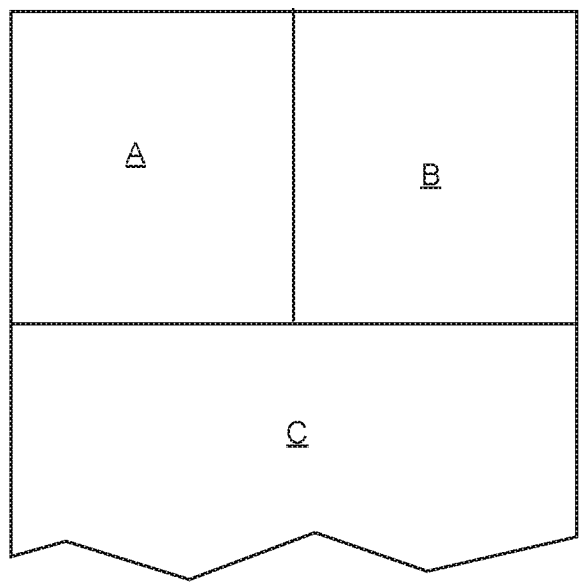
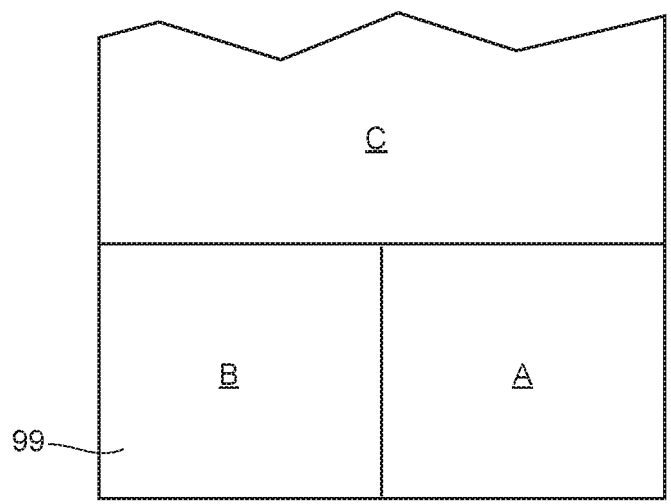

ADJUSTABLE RETURN PATH MAGNET ASSEMBLY AND METHODS

FIELD OF THE INVENTION

The present invention relates to methods and equipment for depositing thin film coatings onto glass and other substrates. In particular, this invention relates to methods and equipment for sputter depositing such coatings.

BACKGROUND OF THE INVENTION

Glass sheets and other substrates can be coated with many different thin film materials. Sputter deposition (or "sputtering") is one method of depositing such coatings. Sputtering is advantageous in that it can deposit a wide variety of different film materials at well controlled thicknesses. Film uniformity, however, is sometimes adversely impacted by the limitations of conventional sputter deposition equipment and process control. For example, various process phenomena, such as the so-called "cross-corner effect," can negatively impact film uniformity. Also, over the course of a production run, process conditions can change (or "drift"), causing uniformity problems. More generally, with conventional hardware and process control, the deposition rate can vary significantly at different points on the substrate due to local process conditions differing at various points on the sputtering target.

It would be desirable to provide sputter deposition equipment that is locally adjustable so as to compensate for differences in local process conditions across a sputtering target. It would be particularly desirable to provide equipment of this nature that is locally adjustable without having to move an entire magnet assembly relative to the sputtering target. Further, it would be desirable to provide sputter deposition methods wherein process conditions are adjusted locally. It would be particularly desirable to provide methods of this nature that involve adjusting the process conditions locally without locally moving an entire magnet assembly relative to the sputtering target.

BRIEF DESCRIPTION OF THE DRAWINGS

FIG. 6 is a schematic front view of various zones of the sputtering target of FIG. 5.

SUMMARY

Figure 1:
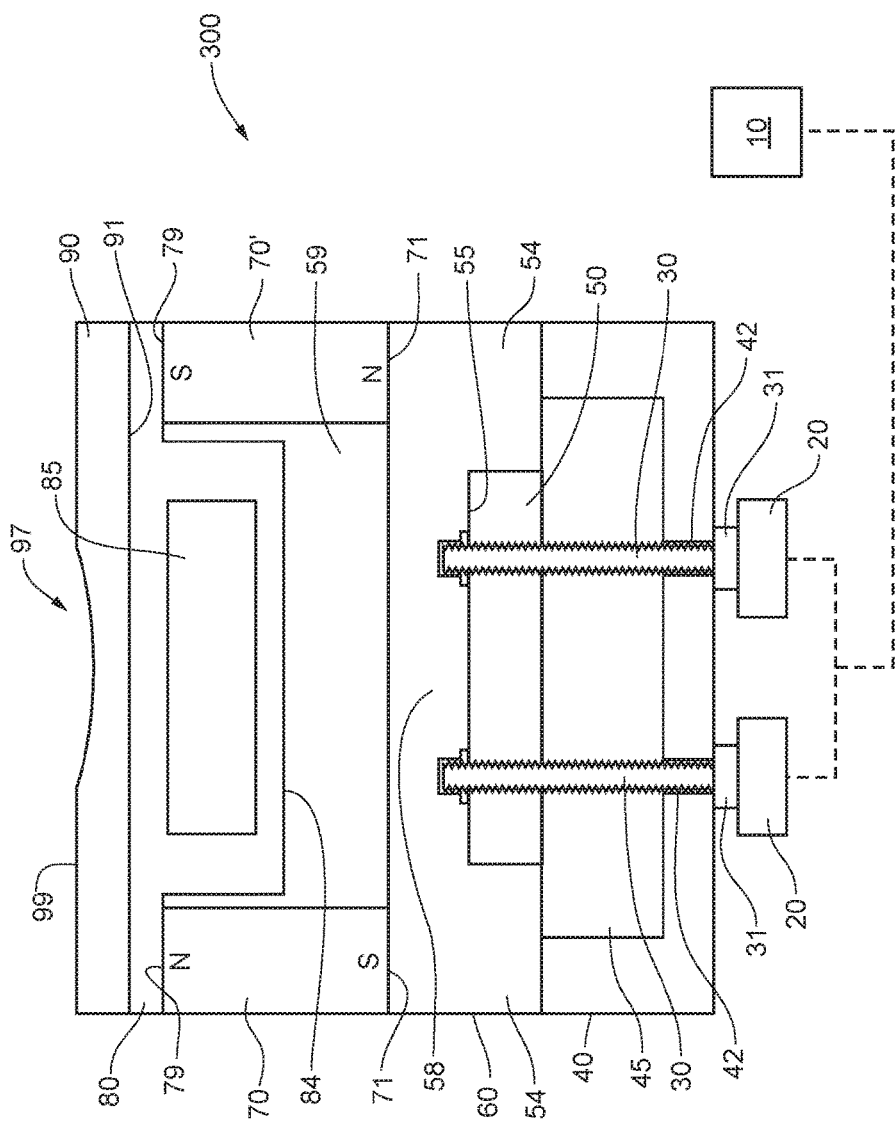
FIG. 1 is a schematic cross-sectional end view of a sputter deposition assembly including a planar sputtering target and an adjustable return path magnet assembly in accordance with an embodiment of the present invention, wherein a magnetic control body of the magnet assembly is shown in a first position.

In some embodiments, the invention provides a sputter deposition assembly comprising a sputtering chamber, a sputtering target, and a magnet assembly. The magnet assembly is mounted adjacent to a rear surface of the sputtering target. The magnet assembly includes a magnetic backing plate and spaced-apart first and second permanent magnets. The first and second permanent magnets each have a proximal end and a distal end. The distal end is further from the sputtering target than is the proximal end. The magnet assembly creates a magnetic field comprising field lines that extend from the proximal end of the first magnet, through the sputtering target, along an arc located in front of the sputtering target, back through the sputtering target, to the proximal end of the second permanent magnet, through the second permanent magnet, along a return path, and to the distal end of the first permanent magnet. The return path passes through the magnetic backing plate of the magnet assembly. The magnetic backing plate is a plate-shaped wall formed of ferromagnetic or ferrimagnetic material. The plate-shaped wall extends between the first and second permanent magnets and defines a blind recess. The magnet assembly further includes a magnetic control body mounted moveably relative to the magnetic backing plate. The magnetic control body has first and second positions. The magnetic control body when in the first position is disposed further into the blind recess of the magnetic backing plate than when in the second position.

Certain embodiments of the invention provide a method of operating a sputter deposition assembly comprising a sputtering chamber, a sputtering target, and a magnet assembly. The magnet assembly is mounted adjacent to a rear surface of the sputtering target. The magnet assembly includes a magnetic backing plate and spaced-apart first and second permanent magnets. The first and second permanent magnets each have a proximal end and a distal end. The distal end is further from the sputtering target than is the proximal end. The method involves using the magnet assembly to create a magnetic field comprising field lines that extend from the proximal end of the first magnet, through the sputtering target, along an arc located in front of the sputtering target, back through the sputtering target, to the proximal end of the second permanent magnet, through the second permanent magnet, along a return path, and to the distal end of the first permanent magnet. The return path passes through the magnetic backing plate of the magnet assembly. The magnetic backing plate defines a blind recess. The method includes moving a magnetic control body relative to the magnetic backing plate between first and second positions. The magnetic control body when in the first position is disposed further into the blind recess of the magnetic backing plate than when in the second position.

DETAILED DESCRIPTION

The following detailed description is to be read with reference to the drawings, in which like elements in different drawings have like reference numerals. The drawings, which are not necessarily to scale, depict selected embodiments and are not intended to limit the scope of the invention. Skilled artisans will recognize that the examples provided herein have many useful alternatives that fall within the scope of the invention.

The present invention provides an adjustable sputter deposition system. The system offers exceptional performance in terms of its ability to achieve uniform film deposition in a wide variety of sputter deposition processes. For example, by providing an adjustable return path magnet assembly, it is possible to compensate for various process phenomena that may otherwise negatively impact the uniformity of the resulting film. In addition, the adjustability of the present magnet assembly can be used to address various process drift situations. Preferably, the system can be adjusted locally without needing to move the primary magnets of the magnet assembly (or the entire magnet assembly) closer to or further from the sputtering target.

Figure 5:
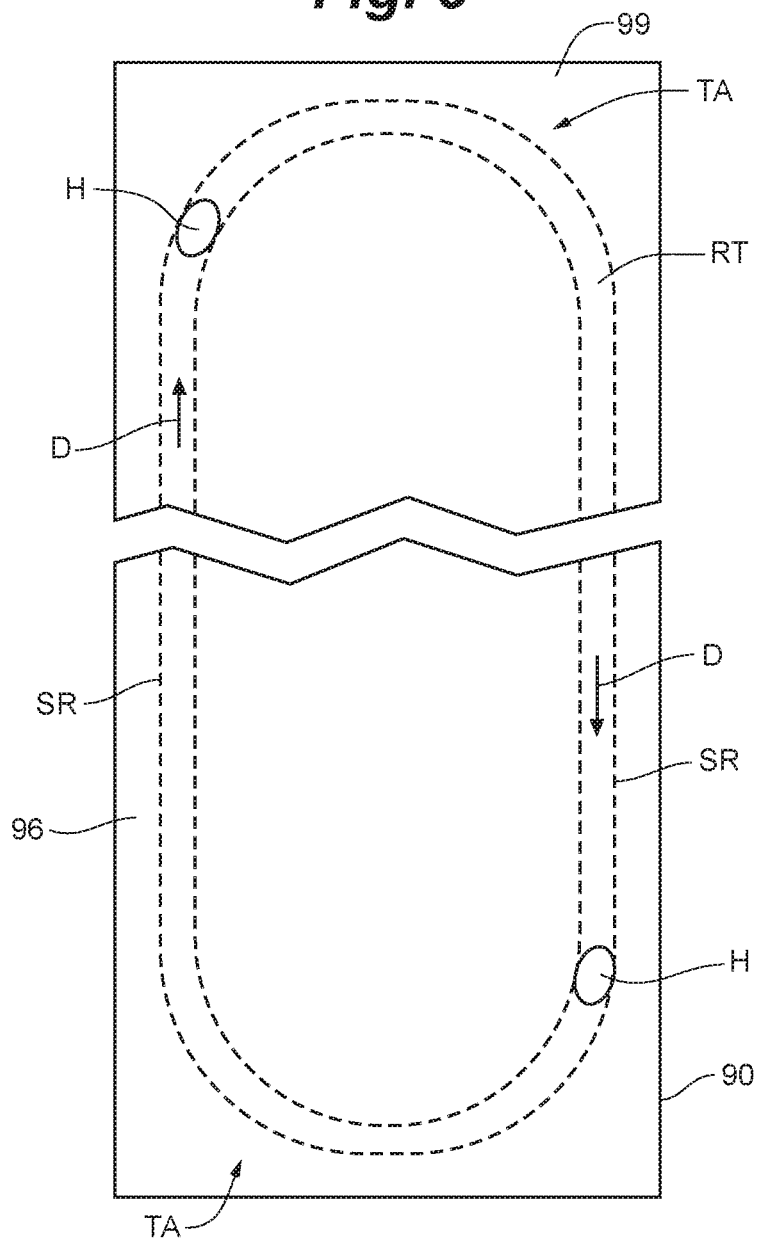
FIG. 5 is a schematic front view of a sputter deposition assembly that includes a planar sputtering target and an adjustable magnet assembly in accordance with certain embodiments of the invention.

The invention provides a sputter deposition assembly 100 that includes a sputtering chamber 200, a sputtering target 90, and a magnet assembly 300. The magnet assembly 300 is mounted adjacent to a rear surface 91 of the target 90. The magnet assembly 300 includes a plurality of primary magnets 70, 70' that generate a magnetic field (e.g., a magnetron magnetic field) 150. Preferably, the magnet assembly 300 is configured in a racetrack arrangement RT that includes: (i) two generally parallel elongated side regions SR, and (ii) two curved turnaround regions TA at opposite ends of the racetrack arrangement. Reference is made to FIG. 5.

The magnet assembly 300 includes a magnetic backing plate 60 and laterally spaced-apart first and second permanent magnets 70, 70'. The first and second permanent magnets 70, 70' each have a proximal end 79 and a distal end 71. The distal end 71 is further from the adjacent rear surface 91 of the sputtering target 90 than is the proximal end 79. The magnet assembly 300 creates a magnetic field 150 comprising field lines 155 that extend from the proximal end 79 of the first magnet 70, through the sputtering target 90, along an arc located in front of the sputtering target, back through the sputtering target, to the proximal end 79 of the second permanent magnet 70', through the second permanent magnet, along a return path, and to the distal end 71 of the first permanent magnet 70. This is perhaps best appreciated by referring to FIG. 9. The return path passes through the magnetic backing plate 60 of the magnet assembly 300.

Figure 9:
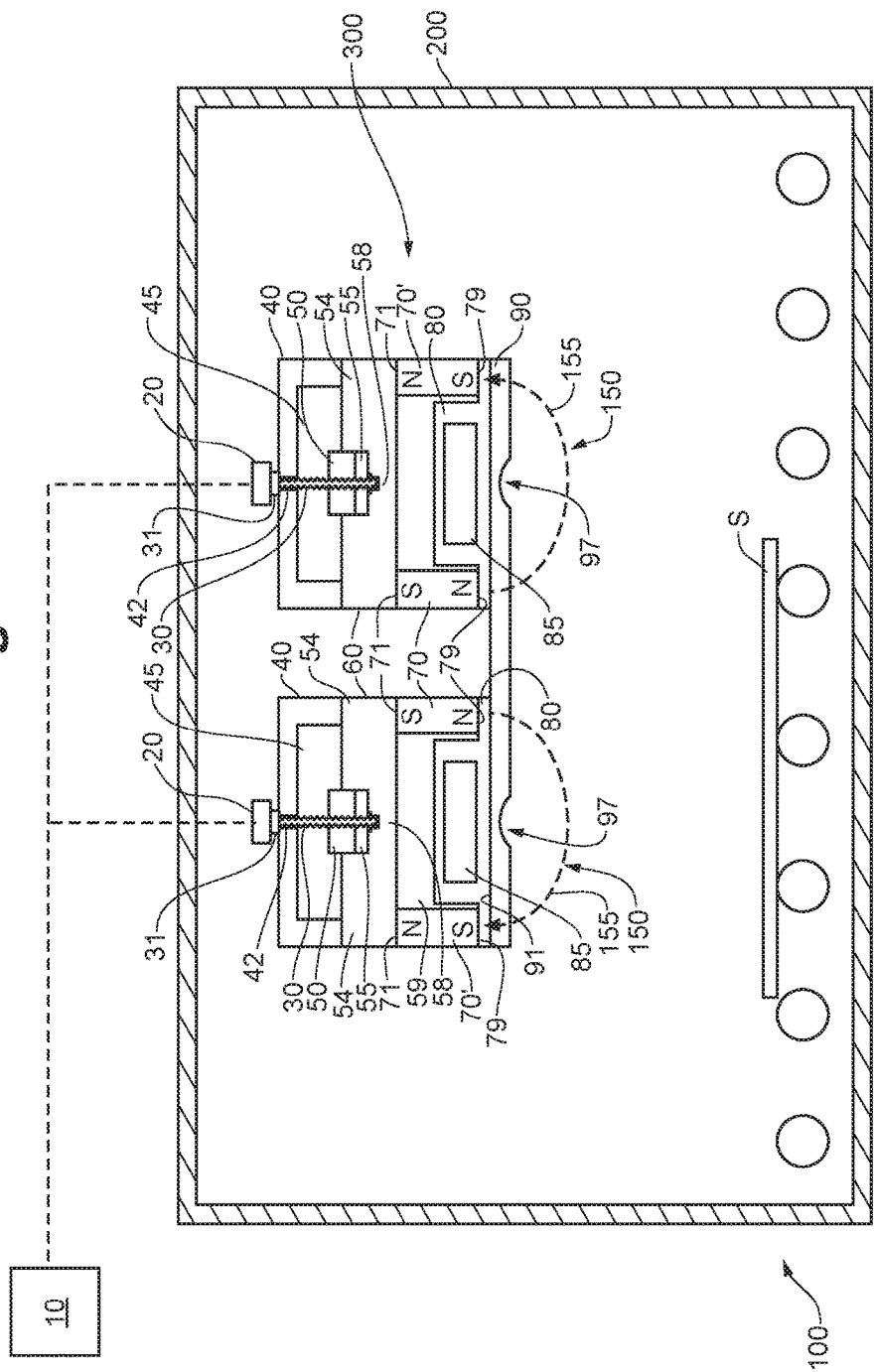
FIG. 9 is a schematic cross-sectional side view of a sputter deposition assembly including a sputtering chamber, a sputtering target, and an adjustable magnet assembly in accordance with certain embodiments of the invention.

The magnetic backing plate 60 is a plate-shaped wall. Preferably, it is formed of soft magnetic material, such as ferromagnetic or ferrimagnetic material. This plate-shaped wall extends between the first 70 and second 70' permanent magnets and defines a blind recess 55. Preferably, the blind recess 55 is open in a direction facing away from the adjacent rear surface 91 of the sputtering target 90. The blind recess 55, for example, can open in a direction facing away from the adjacent area where target erosion is to occur during sputtering (i.e., a sputtering zone). This may involve the blind recess 55 being open in a direction facing away from the path of substrate travel. Reference is made to FIG. 9.

In the embodiments of FIGS. 1-4, the blind recess 55 is located at a lateral midpoint (e.g., at the center, as measured along the lateral axis LA) of the magnetic backing plate 60. This, however, is not required. Instead, the blind recess can be spaced to one side of the lateral midpoint of the magnetic backing plate. Moreover, there can optionally be two blind recesses, e.g., one spaced a certain distance to one side of the lateral midpoint, the other spaced the same distance to the other side of the lateral midpoint. Many variants of this nature can be provided to accommodate different process and equipment considerations.

In certain embodiments, the magnet assembly 300 is devoid of any movably-mounted permanent magnets located directly between the two laterally spaced-apart magnets 70, 70'. More generally, the magnet assembly 300 preferably is devoid of any permanent magnets located directly between the two laterally spaced-apart magnets 70, 70'. Additionally or alternatively, the magnet assembly 300 can optionally be devoid of any moveable magnetic (e.g., ferromagnetic or ferrimagnetic) bodies, such as shunts, located directly between the two laterally spaced-apart magnets 70, 70'.

Figure 2:
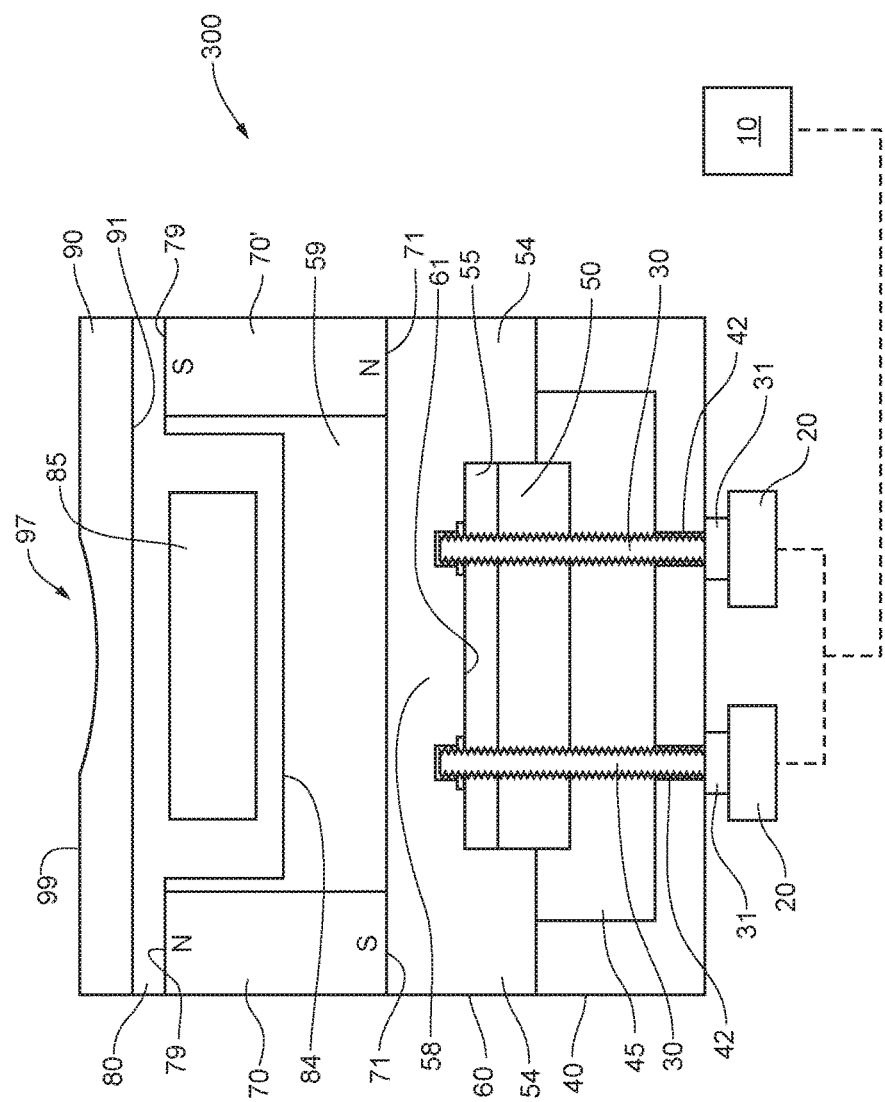
FIG. 2 is a schematic cross-sectional end view of the sputter deposition assembly of FIG. 1, wherein the magnetic control body of the magnet assembly is shown in a second position.
Figure 3:
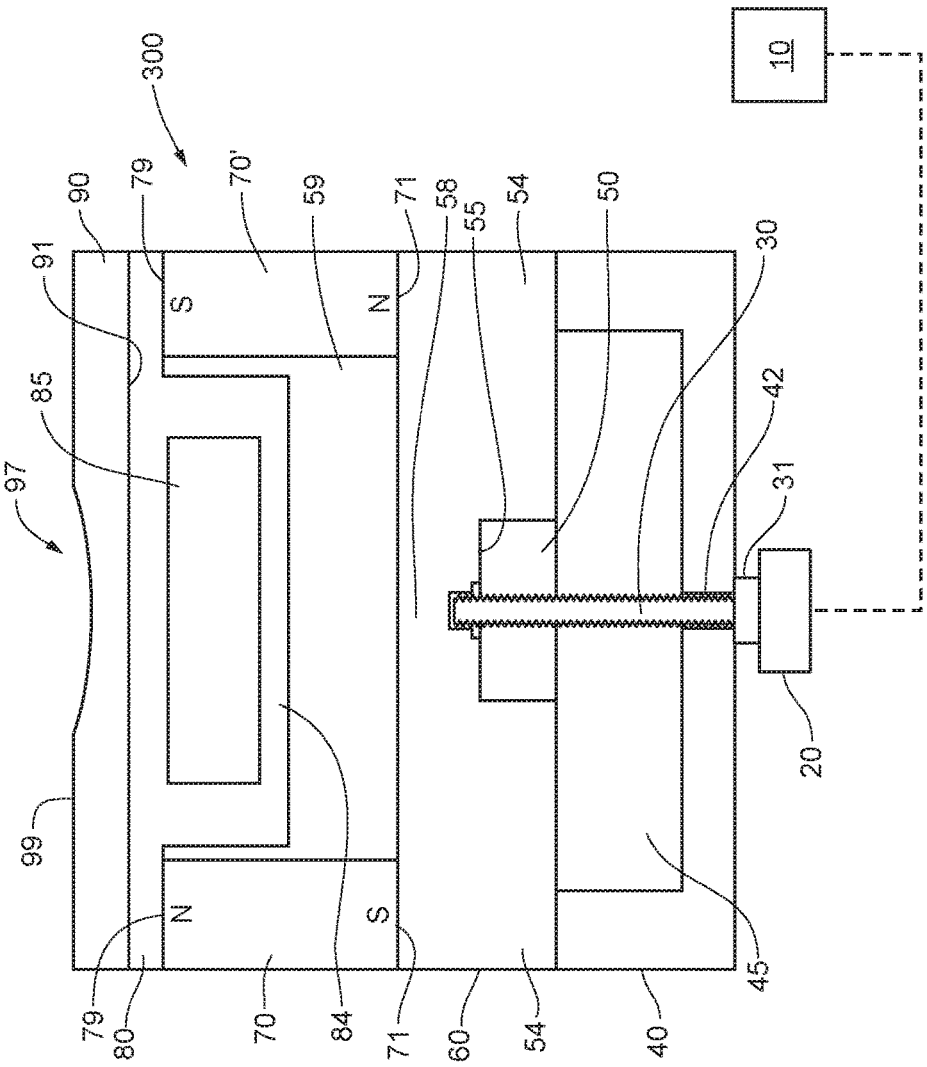
FIG. 3 is a schematic cross-sectional end view of a sputter deposition assembly including a planar sputtering target and an adjustable return path magnet assembly in accordance with another embodiment of the invention, wherein a magnetic control body of the magnet assembly is shown in a first position.
Figure 4:
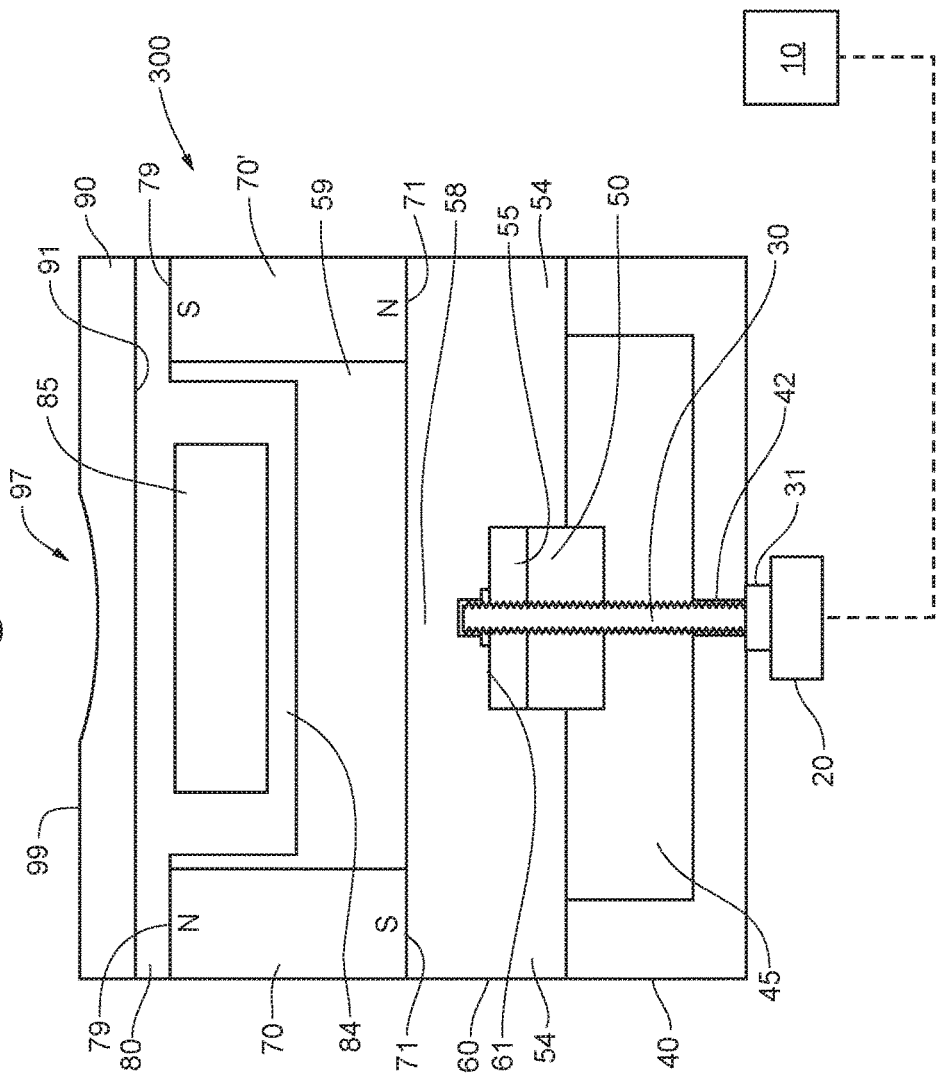
FIG. 4 is a schematic cross-sectional end view of the sputter deposition assembly of FIG. 3, wherein the magnetic control body of the magnet assembly is shown in a second position.

The magnet assembly 300 has a magnetic control body 50 mounted moveably relative to the magnetic backing plate 60. The magnetic backing plate 60 preferably is mounted in a fixed position relative to the sputtering target. FIGS. 1 and 2 depict an embodiment wherein the magnetic control body 50 is formed of soft magnetic material, such as ferromagnetic or ferrimagnetic material. FIGS. 3 and 4 depict an embodiment wherein the magnetic control body 50 comprises a permanent magnet. Thus, in some embodiments, the magnetic control body 50 either is a permanent magnet or is formed of soft magnetic material, such as ferromagnetic or ferrimagnetic material.

The magnetic control body 50 has first and second positions. When the magnetic control body 50 is in the first position, it is disposed further into the blind recess 55 than when in the second position. In more detail, the magnetic control body 50 preferably is movable toward and away from the magnetic backing plate 60. In such cases, the magnetic control body 50 moves away from the magnetic backing plate 60 in moving from its first position to its second position, whereas the magnetic control body moves toward the magnetic backing plate in moving from its second position to its first position. This can be appreciated by comparing FIG. 1 with FIG. 2, and by comparing FIG. 3 with FIG. 4.

As can be appreciated by referring to FIG. 9, movement of the magnetic control body 50 toward the magnetic backing plate 60 may involve the magnetic control body moving toward the path of substrate travel. Conversely, movement of the magnetic control body 50 away from the magnetic backing plate 60 may involve the magnetic control body moving away from the path of substrate travel.

The sputter deposition assembly 100 is configured such that the magnetic field 150 (e.g., a component thereof parallel to an adjacent front surface of the sputtering target and/or a region thereof) located in front of the sputtering target 90 changes in strength, configuration, or both in response to movement of the magnetic control body 50 between its first and second positions (e.g., in response to movement of the magnetic control body toward or away from the backing plate 60). Preferably, the component of the magnetic field parallel to the adjacent front surface of the target changes in strength in response to such movement of the magnetic control body. Thus, it is possible to adjust the magnetic field 150 in front of the sputtering target 90 without having to physically move the permanent magnets

70, 70' (or the whole magnet assembly 300) closer to or further from the adjacent rear surface 91 of the target. This makes it possible to avoid large, complicated, and/or less reliable systems that may otherwise be provided to move the permanent magnets 70, 70' (or the whole magnet assembly 300) toward or away from the adjacent rear surface of the target.

In more detail, the embodiments of FIGS. 1-4 are configured and operated such that the strength of a component of the magnetic field 150 parallel to the adjacent front surface of the target: (i) increases in response to movement of the magnetic control body 50 toward the magnetic backing plate 60, and (ii) decreases in response to movement of the magnetic control body 50 away from the magnetic backing plate 60. As will be appreciated, when the strength of the component of the magnetic field 150 parallel to the adjacent front surface of the target increases, the local sputtering rate increases, and when the strength of the component of the magnetic field 150 parallel to the adjacent front surface of the target decreases, the local sputtering rate decreases.

The magnetic backing plate 60 preferably comprises (e.g., is) a plate-shaped wall that extends continuously and entirely between the two permanent magnets 70, 70'. This is shown in FIGS. 1-4. Here, the plate-shaped wall is a single body. This wall preferably is parallel (or at least generally parallel) to the adjacent rear surface 91 of the target 90. This is the case in the embodiments of FIGS. 1-4, 9, and 10. In these embodiments, the plate-shaped wall is in contact with both permanent magnets 70, 70'. This, however, is not required. For example, two magnetic shunts or the like may be positioned respectively between the two ends of the magnetic backing plate and the two permanent magnets.

The illustrated magnetic backing plate 60 comprises a central wall portion 58 located between two lateral wall portions 54. Here, the central wall portion 58 has a smaller thickness than the two lateral wall portions 54. In the embodiments illustrated in FIGS. 1-4 and 7-10, the central wall portion 58 defines a bottom of the blind recess 55. In both embodiments of FIGS. 1-4, the two lateral wall portions 54 are mounted respectively against (optionally directly against, i.e., so as to contact) the distal ends 71 of the two permanent magnets 70, 70'.

As shown in FIGS. 1 and 3, in some embodiments, the magnetic control body 50 when in the first position is bottomed-out in the blind bore 55 (e.g., so as to contact a confronting face 61 of the central wall portion 58, which face 61 defines the bottom of the blind bore) of the magnetic backing plate 60, and when in the second position is spaced apart from the bottom of the blind bore (i.e., is spaced apart from the confronting face 61 of the central wall portion). In such cases, the magnetic backing plate 60 may be devoid of empty pockets of space, e.g., between the magnetic control body and the bottom of the blind bore. Thus, the magnetic backing plate 60 provides (e.g., forms) a lower resistance return path when the magnetic control body 50 is in its first position than when in its second position. It is not required that the magnetic control body 50 when in the first position be bottomed-out in the blind bore 55. Instead, the magnetic control body when in the first position can merely be disposed further into the blind bore than when in the second position. In such embodiments, the magnetic control body when in the second position is spaced further from the face of the central wall portion that defines the bottom of the blind bore than when in the first position.

In connection with the adjustability of the magnetic control body 50, some embodiments provide one or more threaded shafts 30 coupled to the magnetic control body such that it moves toward the magnetic backing plate 60 (e.g., further into the blind bore 55) in response to rotation of the threaded shaft(s) in a first direction, and moves away from the magnetic backing plate (e.g., further out of the blind bore) in response to rotation of the threaded shaft(s) in a second direction. In the embodiment of FIGS. 1 and 2, the magnetic control body 50 is coupled with two laterally spaced-apart threaded shafts 30. In the embodiment of FIGS. 3 and 4, the magnetic control body 50 is coupled with a single threaded shaft 30. It is to be appreciated, however, that based upon the length (i.e., the dimension extending along a longitudinal axis LO) of the magnetic control body 50, it may be coupled with two or more longitudinally spaced-apart threaded shafts 30.

In embodiments where the magnetic control body 50 is adjustable by virtue of one or more threaded shafts 30, each threaded shaft can optionally be coupled to a motor 20 configured to rotate such threaded shaft(s). Thus, in certain embodiments, the magnetic control body is adapted to move between its first and second positions in response to operation of a motor. This can also be the case for embodiments that do not include the threaded shafts 30. Moreover, in certain embodiments, the system includes a control unit 10 connected with each motor 20, in some cases to control rotation of one or more threaded shafts 30. When provided, the control unit 10 preferably is located at a position external to the sputtering chamber 200, whereby an operator can initiate movement of the magnetic control body 50 relative to the magnetic backing plate 60 from outside the sputtering chamber 200 without having to open the sputtering chamber, stop sputtering the target 90, or both.

In some embodiments, to get signals and power inside the sputtering chamber 200 (vacuum) and inside the cathode body, a programmable computer is set-up outside the coater. The computer is programmed to run a program addressing the individual motors inside, with feedback to indicate the current location of the movable control bodies (which in some cases are moveable control shunts). The motors can optionally be stepper motors, and the system may be set up to count forward and backward steps. The power to step the motors can optionally be fed into the cathode from a power-source outside the coater, similar to the cathode cooling water. Sealing to atmosphere can be done by multiple pin high vacuum capable feedthroughs. The interface (computer/motor) used to direct the stepping signals can optionally be outside the coater, e.g., permanently attached to the top lid, which carries the installations supplying and controlling the cathode. The motors are located inside the internal vacuum of the cathode. To protect them from overheating, they can optionally be cooled using the available cooling water by heat conducting attachment. In other embodiments, only one power line and one signal line connect the control computer (outside vacuum) to the inside of the cathode. The interface to multiplex the stepping power to the addressed motor can optionally be inside the body of the cathode. In various embodiments of many such types, the inside of the cathode will be at different high voltages (against ground) during operation. In such cases, it will be appropriate to use high voltage insulation gear (insulation transformers) capable of safe transformation of the stepping power-signals and the multiplexer command signals to the motors and controls inside the cathode.

In some alternate embodiments that include the threaded fasteners 30, their adjustment does not involve operating motors. Instead, the adjustments are done manually, e.g., using hand-held tools to independently adjust the position of each magnetic control body 50.

In some cases, the magnetic control body 50 is mounted movably relative to a non-magnetic support wall 40. In such cases, the non-magnetic support wall 40 (or at least a mount portion thereof) preferably is located further from the adjacent rear wall 91 of the sputtering target 90 than is the magnetic backing plate 60. Thus, the magnetic control body 50 may be mounted movably between a non-magnetic support wall 40 and the magnetic backing plate 60. The magnet assembly 300, for example, can optionally comprise a non-magnetic support wall 40 to which are mounted one or more threaded shafts 30 of the nature described above. As is perhaps best shown in FIGS. 1-4, for example, such threaded shaft(s) 30 can optionally be mounted in one or more corresponding bores 42 of the non-magnetic support wall 40. In FIGS. 1-4, the magnetic control body 50 is mounted movably in a channel 45 bounded collectively by the non-magnetic support wall 40 and the magnetic backing plate 60.

With continued reference to FIGS. 1-4, the system preferably includes a cooling plate 80 that defines a cooling channel 85 through which water flows during sputtering. Here, the illustrated cooling plate 80 is carried alongside the rear surface 91 of the sputtering target 90, optionally such that the cooling channel 85 is located directly between the first 70 and second 70' permanent magnets.

Typically, the blind recess 55 is an elongated channel having an elongated racetrack configuration RT that includes two parallel elongated straight regions SR and two curved turnaround regions TA. Reference is made to FIG. 5. The magnet assembly 300 preferably includes a series of magnetic control bodies 50 each mounted for independent movement relative to the sputtering target 90. Preferably, the magnetic control bodies 50 are positionable independently so that, if desired, different magnetic control bodies can be disposed in the channel (i.e., in the blind recess 55) to different extents. In some embodiments, the channel is provided with (e.g., receives) a plurality of magnetic control bodies 50 located at: (i) each of the two parallel elongated straight regions SR of the elongated racetrack configuration, and (ii) each of the two curved turnaround regions TA of the elongated racetrack configuration RT. This is perhaps best appreciated by referring to FIGS. 7 and 8.

Figure 10:
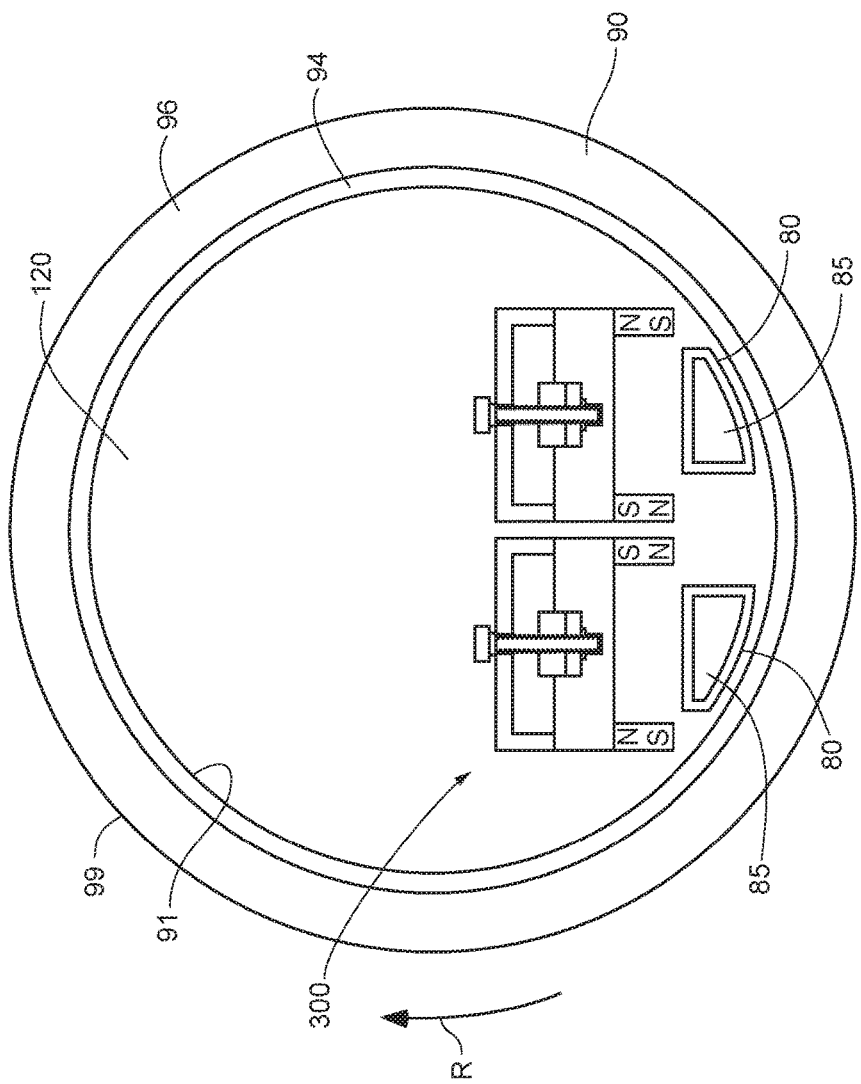
FIG. 10 is a schematic cross-sectional side view of a sputter deposition assembly including a cylindrical sputtering target and an adjustable magnet assembly in accordance with certain embodiments of the invention.

The system can involve a planar or cylindrical sputtering target. FIGS. 1-4 and 9 depict planar targets, while FIG. 10 depicts a cylindrical target. In many cases, the target 90 will include a support plate (or, in the case of a cylindrical target, a support tube) 94 on which a layer of sputterable material 96 is provided. It will be appreciated that many different sputterable materials can be used, depending upon the film(s) to be deposited. In one group of embodiments, the sputterable material includes both indium and tin. The sputterable material, for example, can be a metallic indium-tin compound (e.g., an alloy comprising or consisting of indium and tin). In another group of embodiments, the sputterable material includes silver. The sputterable material, for example, can consist of metallic silver or a metallic alloy comprising silver. These two groups of embodiments are notable in that the films sputtered from targets of these types would tend to drive particular benefit from exceptional uniformity control.

The foregoing examples of sputterable material options, however, are by no means limiting. To the contrary, the sputterable material of the present target 90 can have a wide variety of compositions, depending upon the type of film to be deposited. Other non-limiting possibilities for the sputterable material include titanium, titanium suboxide, silicon (optionally doped with a small amount of aluminum), zinc, tin, or a metallic compound of zinc and tin.

If desired, one or more intermediate layers can be provided between the optional support plate (or support tube) and the layer of sputterable material. One or more conventional adhesion layers may be beneficial, depending upon the compositions of the sputterable material and the target backing. When provided, an adhesion layer may have a coefficient of thermal expansion between that of the target backing and that of the sputterable material. Skilled artisans will be familiar with various options for such interlayers. Further, it is to be appreciated that in some embodiments, the target does not have a separate backing plate or backing tube, but rather the entire target is formed by the sputterable material itself.

In embodiments involving a cylindrical sputtering target, the magnet assembly 300 is mounted inside the target 90, i.e., within an interior space 120 bounded by the target. This is shown in FIG. 10. Preferably, one or more cooling fluid channels (e.g., water channels) 85 are also provided inside the target 90 so as to be in thermal contact with the rear surface 91 of the target 90. When a cylindrical target is used, it is conventional to mount it rotatably to an end block of the sputter deposition system. End blocks, and the manner in which cylindrical targets are mounted rotatably to one or two end blocks, are well known to skilled artisans.

As noted above, the magnet assembly 300 is mounted adjacent to a rear surface 91 of the target 90. The opposite surface of the target, i.e., the front surface 99, is defined by the sputterable material. Thus, it is the front surface 99 of the target 90 from which sputterable material is ejected toward a substrate (e.g., a glass sheet) S during sputtering. In planar target embodiments, an erosion trench 97 is formed in the front surface 99 of the target 90 during sputtering. As described previously, the magnetic field 150 forms a closed-loop tunnel above the target 90. Thus, when sputtering a planar target, an erosion trench 97 is formed by ion bombardment of the target 90. This ion bombardment results from the high density of plasma trapped by the magnetic field 150 adjacent to the front surface 99 of the target 90. The erosion trench 97 on a planar target will typically be located between (e.g., centered between) the laterally spaced-apart inner 70 and outer 70' primary magnets. When sputtering a rotating cylindrical target (e.g., of the nature shown in FIG. 10), the erosion typically creates a well-known dog-bone shape on the target.

Figure 7:
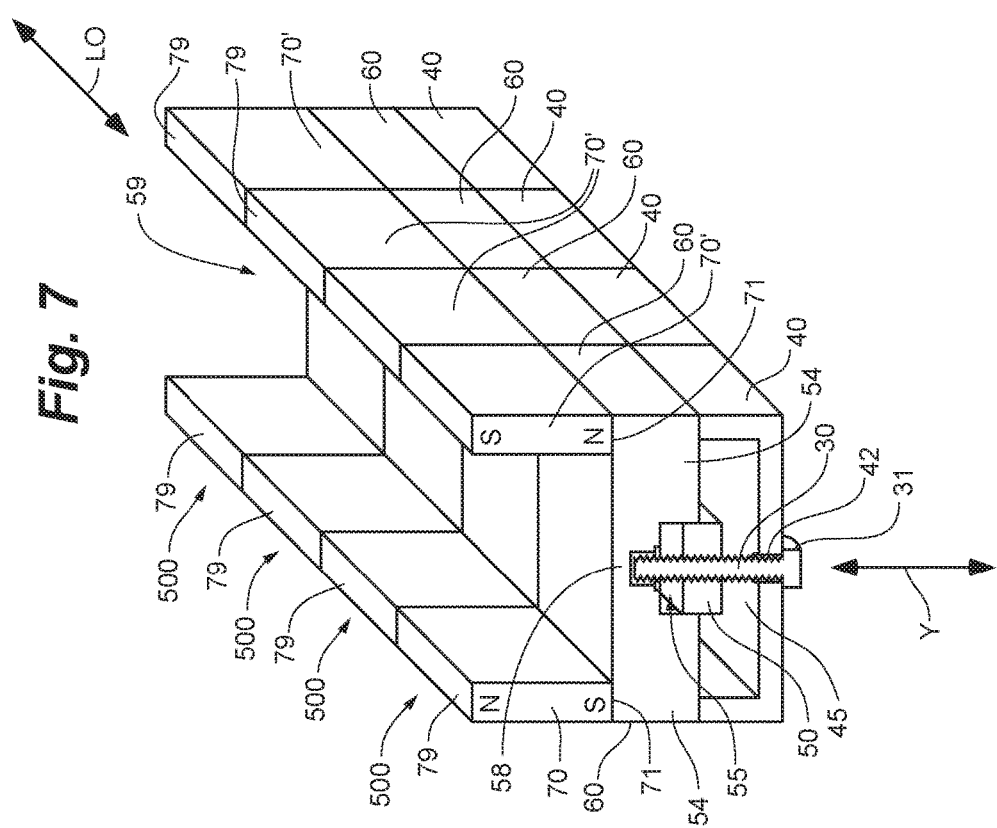
FIG. 7 is a schematic perspective view of a portion of an elongated side region of an adjustable magnet assembly in accordance with certain embodiments of the invention
Figure 8:
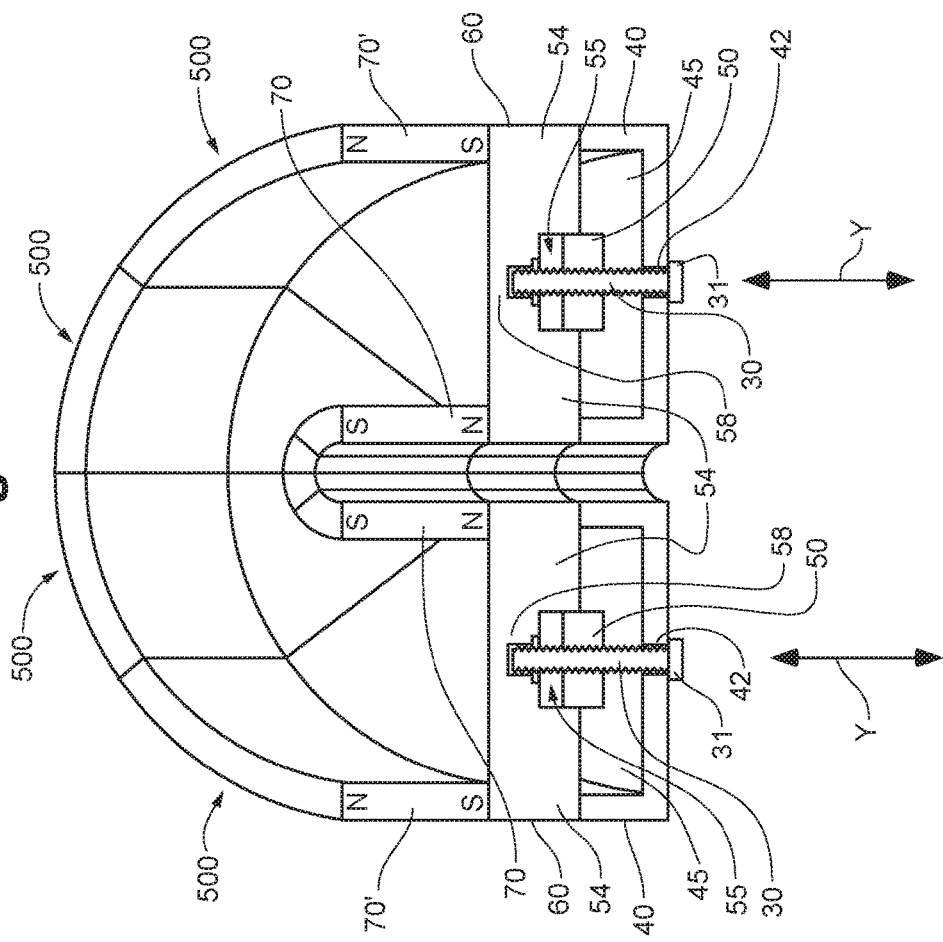
FIG. 8 is a schematic perspective view of a curved turnaround region of an adjustable magnet assembly in accordance with certain embodiments of the invention.

The magnet assembly 300 preferably includes a series of magnet assembly segments 500. In embodiments of this nature, each magnet assembly segment 500 preferably includes an inner magnet 70, an outer magnet 70', and a magnetic backing plate 60. These components have been described. In some cases, the magnet assembly segments 500 are mounted end-to-end so as to collectively form the racetrack arrangement RT. Reference is made to FIGS. 5, 7, and 8.

The present magnet assembly 300 is advantageous in that the magnet assembly segments 500 need not be moved (e.g., are mounted such that they are not independently moveable) in their entirety toward or away from the sputtering target 90 in order to locally adjust the magnetic field 150. Instead, local adjustments can be made (e.g., the strength of the component of the magnetic field parallel to the adjacent front surface of the target can be changed locally) simply by moving the magnetic control bodies 50 of the respective magnet assembly segments 500. As noted above, this can be done by independently moving one or more of the magnetic control bodies toward or away from the respective backing plates 60 of the magnet assembly 300. The terms "local adjustment," "locally adjust," and the like as used herein refer to changing the magnetic field independently at different length segments of the racetrack. Preferably, the independently adjustable length segments collectively form the entire length of the racetrack.

In the embodiments illustrated, the magnet assembly 300 comprises a plurality of primary magnets, including a series of inner magnets 70 and a series of outer magnets 70'. Preferably, the outer magnets 70' all have the same field orientation and are arranged in a closed loop. Likewise, the inner magnets 70 preferably all have the same field orientation (which is opposite to that of the outer magnets) and are arranged in a closed loop. One suitable closed loop arrangement of this nature can be appreciated by referring to FIG. 5, which schematically depicts an embodiment wherein the magnet assembly 300 is configured in a racetrack arrangement RT having: (i) two generally parallel elongated side regions SR, and (ii) two curved turnaround regions TA at opposite ends of the racetrack arrangement. The racetrack arrangement RT can optionally consist of the two side regions SR and the two turnaround regions TA. It is to be understood, however, that the magnet assembly 300 can alternatively be configured in various other arrangements so as to create racetracks of different shapes.

As is perhaps best appreciated by referring to FIG. 7, the series of inner magnets 70 and the series of outer magnets 70' can advantageously be coupled so as to constitute a series of adjacent magnet pairs, with each pair consisting of an inner magnet 70 and an outer magnet 70'. As illustrated, the two magnets 70, 70' of each adjacent magnet pair are spaced apart so as to confront each other. In some cases, the space directly between the two magnets 70, 70' of each adjacent magnet pair is devoid of any magnet. In such cases, for example, there is no permanent magnet located directly between the two primary magnets 70, 70' of each adjacent magnet pair.

In FIGS. 1-4 and 7-10, the inner 70 and outer 70' magnets are shown as discrete permanent magnets, and the magnetic backing plate 60 is shown as a discrete shunt. More generally, though, each magnet assembly segment 500 can have two permanent magnets, two coils, one permanent magnet and one coil, etc. The illustrated magnetic backing plate 60 can be a single plate against which are mounted an inner magnet 70 and an outer magnet 70'. In some cases, the magnetic backing plate 60 is formed of iron. In other cases, cobalt or nickel is used.

In FIGS. 1-4 and 7-10, the magnetic backing plate 60 of each magnet assembly segment 500 comprises (e.g., is) a single plate against which the inner 70 and outer 70' magnets are mounted. In more detail, the illustrated inner 70 and outer 70' magnets are both mounted alongside (e.g., carried against) a single side of the magnetic backing plate 60. Alternatively, the inner and outer magnets of each magnet assembly segment can be mounted alongside (e.g., carried against) two opposed ends of a magnetic backing plate (e.g., such that the magnetic backing plate is positioned directly between end regions of the inner and outer magnets). Thus, the magnetic backing plate 60 and two magnets 70, 70' of each magnet assembly segment 500 preferably collectively form a U-shaped configuration in which the magnetic backing plate defines a base and the two permanent magnets define sides. In such cases, a channel 59 is formed collectively by the magnetic backing plate 60 and the spaced-apart, confronting primary magnets 70, 70'. As noted above, this channel 59 preferably is devoid of any magnet. For example, there preferably is no secondary (or "auxiliary") magnet in the channel 59.

The magnet assembly segments 500 are positioned so as to collectively form a racetrack arrangement RT. This can be appreciated by referring to FIG. 5. In some cases, the magnet assembly segments 500 are mounted end-to-end so as to collectively form the racetrack arrangement RT. In the embodiments illustrated, the segments 50 are carried against one another, optionally such that adjacent segments are in contact with each other. In some cases, the magnet assembly segments may be mounted end-to-end so as to be spaced apart from one another. In such cases, spacers, mounting hardware, and/or other components can be located between adjacent magnet assembly segments.

In preferred embodiments, a plurality of the magnet assembly segments 500 are located at (e.g., define) each of the curved turnaround regions TA. In such embodiments, at each curved turnaround region TA there are multiple, independently adjustable magnet assembly segments 500. Preferably, at least three of the magnet assembly segments 500 define each of the curved turnaround regions TA, such that at each curved turnaround region there are at least three independently adjustable magnet assembly segments. Reference is made to FIG. 8, wherein four of the magnet assembly segments 500 are located at (e.g., define) each of the curved turnaround regions TA, such that at each curved turnaround region there are four independently adjustable magnet assembly segments. In other embodiments, each curved turnaround region is formed by two independently adjustable magnet assembly segments. The two independently adjustable magnet assembly segments at each curved turnaround region may correspond to the two regions A, B shown at each end of FIG. 6.

In certain embodiments, each magnet assembly segment 500 at each curved turnaround region TA is a magnet assembly corner segment having a sector shape. In some cases, there are at least two, or at least three (e.g., four) such magnet assembly corner segments at each curved turnaround region. FIG. 8 shows one such embodiment. Here, each magnet assembly corner segment has a generally triangular configuration, such that when the magnet assembly corner segments are assembled together, they collectively form a semi-circular (e.g., half circle) shape.

As described above, each magnet assembly segment 500 preferably comprises a magnetic control body 50 that is independently moveable selectively toward or away from a corresponding magnetic backing plate 60. It can thus be appreciated, with reference to FIG. 7, that a magnetic control body 50 of each magnet assembly segment 500 preferably can be moved individually in either direction of arrow Y. This allows the magnet assembly segments 500 to be adjusted individually without actually changing the respective distances of their permanent magnets 70, 70' from the adjacent rear surface 91 of the target 90. By adjusting the magnet assembly segments 500 individually in this manner, an operator can locally adjust the sputtering rate. Thus, it is possible to tailor the sputter deposition assembly 100 for each process to be carried out and/or to make changes over time as a process progresses. The particular positions desired for the magnetic control bodies 50 of the different magnet assembly segments 500 can be optimized for each unique process to be conducted. Moreover, as a particular process proceeds, it is possible to fine tune the resulting film uniformity based on changes in the process over time (as may result from the target becoming increasingly consumed, etc.).

As noted above, the magnet assembly 300 can optionally have a plurality of individually adjustable segments 500 at each curved turnaround region TA. Thus, in the embodiment of FIG. 8, the magnetic control bodies 50 of the magnet assembly segments 500 can be moved individually in either direction of arrow Y. This allows an operator to adjust the sputtering rate locally, not only along the side regions SR of the racetrack RT, but also along each turnaround region TA. This is advantageous because it can be particularly challenging to maintain uniformity between the side regions and the turnaround regions.

It can thus be appreciated that the present sputter deposition assembly 100 provides exceptional flexibility in terms of contouring the magnetic field 150 by independently adjusting the magnetic control bodies 50 of different magnet assembly segments 500.

FIG. 9 depicts a sputtering chamber 200 in accordance with certain embodiments of the invention. The sputtering chamber 200 in FIG. 9 is equipped with a single sputtering target 90. While a single planar target is shown, the sputtering chamber can alternatively have a single cylindrical sputtering target. As another alternative, the sputtering chamber can be equipped with two cylindrical targets or two planar targets.

In some embodiments, a control unit 10 is operably coupled with the magnet assembly 300 of a sputtering target 90 in the sputtering chamber 200. Preferably, the control unit 10 is located outside of the sputtering chamber 200, such that an operator can operate the control unit without having to stop sputtering, open the sputtering chamber, or both. In such cases, the operator can adjust the position of one or more (e.g., all) of the magnetic control bodies 50 of the different magnet assembly segments 500 while the chamber 200 remains closed (and under vacuum).

When provided, the control unit 10 can be operated in different ways to adjust the magnetic field 150. This can be done on demand, e.g., by virtue of an operator using the control unit 10 to initiate adjustments when desired. Additionally or alternatively, the control unit 10 itself can autonomously initiate automated corrections or adjustments that impact film uniformity. For example, any of a variety of conventional film thickness measurement systems can be incorporated into the sputter deposition system and coupled with the control unit 10. In such cases, the control unit can be adapted to determine when significant thickness non-uniformities are occurring at certain locations on the glass, and automatically make adjustments to improve uniformity.

The invention also provides methods of operating a sputter deposition assembly 100. The sputter deposition assembly 100 can be of the nature described above. For example, it can include a sputtering chamber 200, a sputtering target 90, and a magnet assembly 30. The magnet assembly 300 is mounted adjacent to a rear surface 91 of the target 90. The magnet assembly 300 includes a magnetic backing plate 60 and spaced-apart first 70 and second 70' permanent magnets. The first 70 and second 70' permanent magnets each have a proximal end 79 and a distal end 71. The distal end 71 is further from the target 90 than is the proximal end 79. The method involves using the magnet assembly 300 to create a magnetic field 150 comprising field lines 155 that extend from the proximal end 79 of the first magnet 70, through the sputtering target 90, along an arc located in front of the sputtering target, back through the sputtering target, to the proximal end 79 of the second permanent magnet 70', through the second permanent magnet, along a return path, and to the distal end 71 of the first permanent magnet 70. The return path passes through the magnetic backing plate 60 of the magnet assembly 300. The magnetic backing plate 60 defines a blind recess 50.

The method involves moving a magnetic control body 50 (e.g., relative to a magnetic backing plate 60) between first and second positions. The magnetic control body 50 when in the first position is disposed further into the blind recess 55 than when in the second position. This can be appreciated by comparing FIG. 1 with FIG. 2, or by comparing FIG. 3 with FIG. 4. Preferably, the blind recess 55 is open in a direction facing away from (or at least facing generally away from) a sputtering zone of the target 90. Movement of the magnetic control body 60 between its first and second positions preferably involves it moving either further into or further out of the blind recess 55.

In more detail, the method preferably involves moving the magnetic control body 50 toward or away from the magnetic backing plate 60. In such cases, the magnetic control body 50 moves away from the magnetic backing plate 60 in moving from its first position to its second position, whereas the magnetic control body moves toward the magnetic backing plate in moving from its second position to its first position. This can also be appreciated by comparing FIG. 1 with FIG. 2, and by comparing FIG. 3 with FIG. 4.

Referring now to FIG. 9, it can be appreciated that movement of the magnetic control body 50 toward the magnetic backing plate 60 may involve the magnetic control body moving toward the path of substrate travel. Conversely, movement of the magnetic control body 50 away from the magnetic backing plate 60 may involve the magnetic control body moving away from the path of substrate travel.

Movement of the magnetic control body 50 between its first and second positions preferably causes a component of the magnetic field parallel to an adjacent front surface of the sputtering target 90 to change in strength. If it is desired to increase the local sputtering rate adjacent to the magnetic control body 50, for example, the magnetic control body can be moved further into the blind recess 55. As explained previously, this reduces the resistance of the return path. In contrast, if it is desired to decrease the local sputtering rate adjacent to the magnetic control body 50, the magnetic control body can be moved further out of the blind recess 55. This increases the resistance of the return path.

In certain embodiments, the magnetic control body 50 when in its first position is in contact with a confronting face 61 of the magnetic backing plate 60, and when in the second position is spaced apart from the confronting face of the magnetic backing plate. In some embodiments of this nature, the method includes moving the magnetic control body 50 from its first position to its second position. Additionally or alternatively, the method may involve moving the magnetic control body 50 from its second position to its first position.

The magnetic control body 50 can optionally be coupled to a motor 20. When provided, the motor 20 can be coupled to the magnetic control body 50 directly, via one or more threaded shafts 30 (e.g., in the manner described above), or via one or more other drive or fastener members. In such cases, the method involves operating the motor 20 to move the magnetic control body 50 between its first and second positions. This movement can be of the nature described above. The system can optionally include a control unit 10 connected with the motor 20 to control operation of the motor. When provided, the control unit 10 preferably is located at a position external to the sputtering chamber 200, whereby an operator can initiate movement of the magnetic control body 50 between the first and second positions from outside the sputtering chamber without having to open the sputtering chamber.

The blind recess 55 preferably is a channel having an elongated racetrack configuration that includes two parallel elongated straight regions SR and two curved turnaround region TA. In embodiments of this nature, the magnet assembly 300 preferably includes a series of other magnetic control bodies 50. In such cases, the method preferably involves moving two or more of the other magnetic control bodies 50 independently relative to the sputtering target 90 such that they are disposed different distances into the channel. Thus, the method may involve an independent adjustment, at each of a plurality of different length segments of the racetrack, of the strength of the component of the adjacent magnetic field that is parallel to the adjacent front surface of the target.

In the foregoing embodiments, the other magnetic control bodies 50 can optionally be coupled respectively to a plurality of motors 20. In such cases, the method preferably involves operating two or more of those motors 20 to move two or more of the other magnetic control bodies 50 such that they are disposed different distances into the channel. Further, the system can advantageously include a control unit 20 operably coupled with the motors 20 and located at a position external to the sputtering chamber 200. In such cases, an operator can initiate independent movement of the other magnetic control bodies without having to open the sputtering chamber.

In some embodiments of the invention, individually adjustable magnet assembly segments 500 are positioned end-to-end along the entirety of the racetrack RT. In other embodiments, individually adjustable magnet assembly segments 500 are provided only at certain locations on the racetrack RT (e.g., locations of particular interest for process control), but not necessarily at all locations along the racetrack RT. For example, the invention provides embodiments wherein the sputter deposition assembly 100 is capable of addressing the so-called "cross-corner effect." Referring to FIG. 5, it will be appreciated that the plasma density at the incoming corner of each turnaround region TA may be greater than at other locations on the racetrack. As a consequence, target erosion may proceed more rapidly at the incoming corners of the turnaround regions TA than at other locations on the racetrack. As depicted schematically in FIG. 5, this can cause the target 90 to be consumed prematurely at the hot spots H. That is, the sputterable material at these hot spots H may be consumed sooner than at other locations on the target 90. Moreover, the higher rate of target erosion at these hot spots can cause non-uniformity of the sputtered film. The present sputter deposition assembly may be particularly advantageous for eliminating or reducing these phenomena.

Thus, in certain embodiments, the invention provides a sputter deposition assembly 100 that can compensate for (i.e., reduce or eliminate) the cross-corner effect. In the present embodiments, the sputter deposition assembly 100 includes a sputtering chamber 200, a sputtering target 90, and a magnet assembly 300. These components can be of the nature described above. The magnet assembly 300, for example, is mounted adjacent to a rear surface 91 of the sputtering target 90. The magnet assembly 30 has a series of primary magnets 70, 70' that generate a magnetic field 150, such that the magnetic field is positioned to establish, adjacent a front surface 99 of the target 90, a plasma racetrack RT around which electrons travel continuously during sputtering and having two generally parallel elongated side regions SR and two curved turnaround regions TA at opposite ends of the plasma racetrack. Each curved turnaround region TA has an incoming corner region and an outgoing corner region. Reference is made to FIG. 5. The magnet assembly 300 includes a series of magnet assembly segments 500. Each magnet assembly segment 500 includes an inner magnet 70, an outer magnet 70', and a magnetic backing plate 60. In the present embodiments, the series of magnet assembly segments 500 includes two adjustable magnet assembly segments located respectively at the two incoming corner regions of the two curved turnaround regions TA and two adjustable magnet assembly segments 500 located respectively at the two outgoing corner regions of the two curved turnaround regions. The magnetic control bodies 50 of these four (and in some cases other, e.g., all) adjustable magnet assembly segments 500 are independently moveable selectively toward or away from their respective backing plates 60, e.g., in the manner described above.

Thus, in the present embodiments, the magnetic control body 50 of a magnet assembly segment 500 at an incoming corner region preferably is adjustable independently of the magnetic control body 50 of an adjustable magnet assembly segment 500 at an adjacent outgoing corner region (by saying "adjacent" here, we refer to the outgoing corner region of the same turnaround region TA). This adjustment changes an incoming-corner-to-outgoing-corner plasma density ratio. By providing independently adjustable magnet assembly segments 500 at the incoming and outgoing corner regions, it is possible to change the magnitude of the plasma density at the incoming corner region relative to the plasma density at the adjacent outgoing corner region. For example, the present magnet assembly 300 can be configured such that a relative adjustment of the magnetic control body or bodies 50 of one or more adjustable magnet assembly segments 500 at an incoming corner region and the magnetic control body or bodies 50 of one or more adjustable magnet assembly segments 500 at the adjacent outgoing corner region establishes a plasma density at the incoming corner region that is substantially equal to the plasma density at the adjacent outgoing corner region. This may result in the strength of the parallel magnetic field component (described above) being substantially the same (e.g., equal) at an incoming corner region as it is as the adjacent outgoing corner region. This is preferably the case for each turnaround region TA.

In the present embodiments, the sputtering chamber 200 and sputtering target 90 can be of the nature described previously. With respect to the magnet assembly 300 in the present embodiments, it may have individually adjustable magnet assembly segments 500 positioned along the entirety of the racetrack RT. This, however, is not required. For example, in the present embodiments, there may simply be one or more individually adjustable magnet segments 500 at each incoming corner of each turnaround region TA and one or more individually adjustable magnet segments 500 at each outgoing corner of each turnaround region. The magnet assembly segments creating the rest of the plasma racetrack may or may not be independently adjustable. Thus, in some of the present embodiment, while the magnet assembly 300 is not adjustable about the entire racetrack RT, it is capable of compensating for the cross-corner effect. This is merely one example; it may be desirable to provide various other arrangements where the magnet assembly 300 is adjustable along only part of the racetrack RT.

The invention also provides methods of operating a sputter deposition assembly 100 so as to compensate for the cross-corner effect. In these methods, the sputter deposition assembly 100 includes a sputtering chamber 200, a sputtering target 90, and a magnet assembly 300. The magnet assembly 300 is located adjacent to a rear surface 91 of the target 90. The magnet assembly 300 has a series of primary magnets 70, 70' generating a magnetic field (e.g., a magnetron magnetic field) 150 that establishes, adjacent a front surface 99 of the target 90, a plasma racetrack RT around which electrons are travelling continuously and having two generally parallel elongated side regions SR and two curved turnaround regions TA at opposite ends of the plasma racetrack. Each curved turnaround region TA has an incoming corner and an outgoing corner. The magnet assembly 300 includes a series of magnet assembly segments 500. Each magnet assembly segment 500 has an inner magnet 70, an outer magnet 70', and a magnetic backing plate 60. The series of magnet assembly segments 500 includes a first adjustable magnet assembly segment 500 located at a first of the incoming corner regions and a second adjustable magnet assembly segment 500 located at a first of the outgoing corner regions. Thus, in the present methods, the "first" and "second" adjustable magnet assembly segments 500 are located respectfully at the incoming and outgoing corner regions of the same turnaround region TA. The methods involve independently adjusting the magnetic control bodies 50 of the respective first and second adjustable magnet assembly segments 500 so as to position those magnetic control bodies different distances from the adjacent rear surface 91 of the target 90.

Thus, the magnetic control body 50 of the first adjustable magnet assembly segment 500 is positioned a first distance from the adjacent rear surface 91 of the target 20, while the magnetic control body 50 of the second adjustable magnet assembly segment 50 is positioned a second distance from the adjacent rear surface of the target. The first and second distances here are different. For example, the first distance may be greater than the second distance, such that the magnetic control body 50 of the first adjustable magnet assembly segment 500 is further from the adjacent rear surface 91 of the target 90 than is the magnetic control body 50 of the second adjustable magnet assembly segment 500. In such cases, at the two noted corner regions, there are different strengths of the component of the magnetic field parallel to the adjacent front surface of the target. This may be advantageous to compensate for the above-noted cross-corner effect.

The present methods may involve moving the magnetic control body 50 of the first adjustable magnet assembly segment 500 relative to (i.e., toward or away from) the adjacent rear surface 91 of the target 90, moving the magnetic control body 50 of the second adjustable magnet assembly segment 500 relative to the adjacent rear surface of the target, or moving the magnetic control bodies 50 of both of these magnet assembly segments 500 relative to the target.

In the present embodiments, the independent adjustment of the magnetic control bodies 50 of the first and second adjustable magnet assembly segments 500 preferably changes an incoming-corner-to-outgoing-corner plasma density ratio. Thus, the magnitude of the plasma density at the incoming corner region relative to the magnitude of the plasma density at the adjacent outgoing corner region preferably changes when the magnetic control bodies 50 of the first and second adjustable magnet assembly segments 500 are adjusted independently. For example, some embodiments involve moving the magnetic control body 50 of the first magnet assembly segment 500 to a position further from an adjacent rear surface 91 of the target 20 than is the magnetic control body 50 of the second magnet assembly segment 500. Such movement of the magnetic control body 50 of the first magnet assembly segment 500 away from the adjacent rear surface of the target 90 may decrease the plasma density at the incoming corner region of the turnaround region TA in question. Thus, in some cases, the present methods involve moving the magnetic control body 50 of the first magnet assembly segment 500 away from the adjacent rear surface of the target 20 so as to reduce the incoming-corner-to-outgoing-corner plasma density ratio. In some cases, the method involves performing such an independent adjustment at each turnaround region TA of the racetrack RT.

Thus, by independently adjusting one or more magnet assembly segments 500 at an incoming corner region relative to one or more magnet assembly segments 500 at the adjacent outgoing corner region, the magnitude of the plasma density at the incoming corner region relative to the plasma density at the adjacent outgoing corner region preferably changes. In certain preferred embodiments, the first and second adjustable magnet assembly segments 500 are adjusted independently (optionally together with independently adjusting one or more other magnet assembly segments 500 located at the first incoming corner region and/or together with adjusting one or more other magnet assembly segments 500 located at the first outgoing corner region) so as to make the plasma density at the first incoming corner region substantially equal to the plasma density at the first outgoing corner region. This may result in the strength of the parallel magnetic field component (described above) being substantially the same at the first incoming corner region as it is at the first outgoing corner region. Adjustments of this nature are preferably conducted for both turnaround regions TA. These adjustment methods are advantageous in that they can compensate for the cross-corner effect.

In some embodiments of the present method, the series of magnet assembly segments 500 includes at least three magnet assembly corner segments mounted side-by-side so as to collectively form a curved turnaround region TA, and the method involves independently adjusting the magnetic control bodies 50 of the magnet assembly corner segments such that at least one of them is positioned a different distance from the adjacent rear surface 91 of the sputtering target 90 (e.g., so as to have a different strength of the component of the magnetic field parallel to the adjacent front surface of the target) than at least one other of them.

In some embodiments, the method involves both: i) independently adjusting one or more magnet assembly corner segments, and ii) independently adjusting one or more magnet assembly segments located on an elongated side region SR of the plasma racetrack RT.

The independent movement of one or more (optionally all) of the magnetic control bodies 50 of the magnet assembly segments 500 preferably is initiated by operating a control unit 10 that actuates a plurality of motors 20 to drive the independent movements. As described previously, the motors 20 in some cases rotate a plurality of fasteners 30. When provided, the fasteners 30 may move axially when they are rotated by the motors 20. In other cases, motors may be provided that simply move respective drive or fastener members axially (i.e., without rotating them). The control unit 10 preferably is located at a position external to the sputtering chamber 200, such that an operator initiates the independent movement from outside the sputtering chamber without opening the sputtering chamber (optionally while maintaining a vacuum inside the chamber).

Any method of the present disclosure can optionally involve operating the sputter deposition assembly 100 so as to deposit a film on a substrate (e.g., a glass substrate) S. In some embodiments, the film is deposited at a thickness of less than 3,000 angstroms. In one example, the film includes both indium and tin and is deposited at a thickness of between 200 and 2,000 angstroms. In other embodiments, the film includes silver and is deposited at a thickness of between 50 and 300 angstroms.

While some preferred embodiments of the invention have been described, it should be understood that various changes, adaptations and modifications may be made therein without departing from the spirit of the invention and the scope of the appended claims.

What is claimed is:

1. A sputter deposition assembly comprising a sputtering chamber, a sputtering target, and a magnet assembly, the magnet assembly being mounted adjacent to a rear surface of the sputtering target, the magnet assembly comprising a magnetic backing plate and spaced-apart first and second permanent magnets, the magnetic backing plate being spaced from the sputtering target, the first and second permanent magnets each having a proximal end and a distal end, the distal ends being further from the sputtering target than are the proximal ends, the magnet assembly creating a magnetic field comprising field lines that extend from the proximal end of the first magnet, through the sputtering target, along an arc located in front of the sputtering target, back through the sputtering target, to the proximal end of the second permanent magnet, through the second permanent magnet, along a return path, and to the distal end of the first permanent magnet, the return path passing through the magnetic backing plate of the magnet assembly, the magnetic backing plate being a plate-shaped wall formed of ferromagnetic or ferrimagnetic material, the plate-shaped wall extending between the first and second permanent magnets and defining a blind recess, the magnet assembly further comprising a magnetic control body mounted moveably relative to the magnetic backing plate, the magnetic control body having first and second positions, the magnetic control body when in the first position being disposed further into the blind recess of the magnetic backing plate than when in the second position, the magnet assembly being devoid of any moveable magnetic body located directly between the first and second permanent magnets, the magnetic field being adjustable without moving the first permanent magnet or the second permanent magnet closer to or further from the sputtering target.

2. The sputter deposition assembly of claim 1 wherein the blind recess is open in a direction facing away from a sputtering zone of the sputtering target.

3. The sputter deposition assembly of claim 1 wherein the sputter deposition assembly is configured such that a component of the magnetic field parallel to an adjacent front surface of the sputtering target changes in strength in response to movement of the magnetic control body between its first and second positions.

4. The sputter deposition assembly of claim 1 wherein the plate-shaped wall extends continuously and entirely between the first and second permanent magnets.

5. The sputter deposition assembly of claim 1 wherein the magnetic backing plate has a central wall portion located between two lateral wall portions, the central wall portion having a smaller thickness than the two lateral wall portions, the central wall portion defining a bottom of the blind recess, and the magnetic control body is mounted relative to the magnetic backing plate so as to be moveable selectively toward or away from the magnetic backing plate.

6. The sputter deposition assembly of claim 5 wherein the two lateral wall portions are mounted respectively against the distal ends of the first and second permanent magnets.

7. The sputter deposition assembly of claim 1 wherein the magnetic control body either is a permanent magnet or is formed of a ferromagnetic or ferrimagnetic material.

8. The sputter deposition assembly of claim 1 wherein the magnetic control body is coupled to one or more threaded shafts such that the magnetic control body moves toward the magnetic backing plate in response to rotation of the one or more threaded shafts in a first direction and moves away from the magnetic backing plate in response to rotation of the one or more threaded shafts in a second direction.

9. The sputter deposition assembly of claim 8 wherein each threaded shaft is coupled to a motor configured to rotate such threaded shaft, the sputter deposition assembly further comprising a control unit connected with each motor to control rotation of the one or more threaded shafts, the control unit being located at a position external to the sputtering chamber, thereby allowing an operator to initiate movement of the magnetic control body relative to the magnetic backing plate from outside the sputtering chamber without having to open the sputtering chamber.

10. The sputter deposition assembly of claim 8 further comprising a non-magnetic support wall, the one or more threaded shafts being mounted in one or more corresponding interiorly threaded bores of the non-magnetic support wall, such that the magnetic control body is mounted movably between the magnetic backing plate and the non-magnetic support wall, the non-magnetic support wall being located further from the sputtering target than is the magnetic backing plate.

11. The sputter deposition assembly of claim 1 further comprising a cooling plate that defines a cooling channel through which water is configured to flow during sputtering, the cooling plate being carried alongside the rear surface of the sputtering target, such that the cooling channel is located between the first and second permanent magnets.

12. The sputter deposition assembly of claim 1 wherein the blind recess is a channel having an elongated racetrack configuration that includes two parallel elongated straight regions and two curved turnaround regions.

13. The sputter deposition assembly of claim 12 wherein the magnet assembly further comprises a series of other magnetic control bodies each mounted for independent movement relative to the sputtering target so as to be independently disposable different distances into the channel.

14. The sputter deposition assembly of claim 13 wherein a plurality of the magnetic control bodies is disposed in the channel at: (i) each of the two parallel elongated straight regions of the elongated racetrack configuration, and (ii) each of the two curved turnaround regions of the elongated racetrack configuration.

15. A method of operating a sputter deposition assembly comprising a sputtering chamber, a sputtering target, and a magnet assembly, the magnet assembly being mounted adjacent to a rear surface of the sputtering target, the magnet assembly comprising a magnetic backing plate and spaced-apart first and second permanent magnets, the magnetic backing plate being spaced from the sputtering target, the first and second permanent magnets each having a proximal end and a distal end, the distal ends being further from the sputtering target than are the proximal ends, wherein the method involves using the magnet assembly to create a magnetic field comprising field lines that extend from the proximal end of the first magnet, through the sputtering target, along an arc located in front of the sputtering target, back through the sputtering target, to the proximal end of the second permanent magnet, through the second permanent magnet, along a return path, and to the distal end of the first permanent magnet, the return path passing through the magnetic backing plate of the magnet assembly, the magnetic backing plate defining a blind recess, the method comprising moving a magnetic control body relative to the magnetic backing plate between first and second positions, the magnetic control body when in the first position being disposed further into the blind recess of the magnetic backing plate than when in the second position, the magnet assembly being devoid of any moveable magnetic body located directly between the first and second permanent magnets, the magnetic field being adjustable without moving the first permanent magnet or the second permanent magnet closer to or further from the sputtering target.

16. The method of claim 15 wherein the blind recess is open in a direction facing away from a sputtering zone of the sputtering target, and wherein said movement of the magnetic control body between the first and second positions involves the magnetic control body moving either further into or further out of the blind recess.

17. The method of claim 15 wherein said movement of the magnetic control body between the first and second positions causes a component of the magnetic field parallel to an adjacent front surface of the sputtering target to change in strength.

18. The method of claim 15 wherein the magnetic control body is coupled to a motor, and the method involves operating the motor to move the magnetic control body between the first and second positions, the sputter deposition assembly further comprising a control unit connected with the motor to control operation of the motor, the control unit being located at a position external to the sputtering chamber, thereby allowing an operator to initiate movement of the magnetic control body between the first and second positions from outside the sputtering chamber without having to open the sputtering chamber.

19. The method of claim 15 wherein the blind recess is a channel having an elongated racetrack configuration that includes two parallel elongated straight regions and two curved turnaround regions, the magnet assembly further comprising a series of other magnetic control bodies, and the method involves moving two or more of the other magnetic control bodies independently relative to the sputtering target so that the two or more of the other magnetic control bodies are disposed different distances into the channel.

20. The method of claim 19 wherein the other magnetic control bodies are coupled respectively to a plurality of motors, and the method involves operating two or more of those motors to move the two or more of the other magnetic control bodies so as to be disposed different distances into the channel, the sputter deposition assembly further comprising a control unit operably coupled with the motors and located at a position external to the sputtering chamber, thereby allowing an operator to initiate independent movement of the other magnetic control bodies without having to open the sputtering chamber.

21. The sputter deposition assembly of claim 1 wherein the magnetic backing plate is mounted in a fixed position relative to the sputtering target.

22. The method of claim 15 wherein the magnetic backing plate is mounted in a fixed position relative to the sputtering target.

23. The sputter deposition assembly of claim 1 wherein the blind recess is located in a span of the magnetic backing plate that is between the first and second permanent magnets.

24. The method of claim 15 wherein the blind recess is located in a span of the magnetic backing plate that is between the first and second permanent magnets.

25. The sputter deposition assembly of claim 1 wherein the first and second permanent magnets have magnetic field orientations opposite of each other and oriented such that a north pole of the first permanent magnet faces toward the sputtering target, whereas a north pole of the second permanent magnet faces away from the sputtering target.

26. The method of claim 15 wherein the first and second permanent magnets have magnetic field orientations opposite of each other and oriented such that a north pole of the first permanent magnet faces toward the sputtering target, whereas a north pole of the second permanent magnet faces away from the sputtering target.

27. The sputter deposition assembly of claim 11 wherein the cooling channel is located directly between the first and second permanent magnets.

\* \* \* \* \*